US009443727B2

(12) United States Patent
Soukhoveev et al.

(10) Patent No.: US 9,443,727 B2
(45) Date of Patent: Sep. 13, 2016

(54) SEMI-POLAR III-NITRIDE FILMS AND MATERIALS AND METHOD FOR MAKING THE SAME

(71) Applicant: Ostendo Technologies, Inc., Carlsbad, CA (US)

(72) Inventors: Vitali Soukhoveev, Gaithersburg, MD (US); Vladimir Ivantsov, Hyattsville, MD (US); Benjamin A. Haskell, Carlsbad, CA (US); Hussein S. El-Ghoroury, Carlsbad, CA (US); Alexander Syrkin, Montgomery Village, MD (US)

(73) Assignee: Ostendo Technologies, Inc., Carlsbad, CA (US)

(*) Notice: Subject to any disclaimer, the term of this patent is extended or adjusted under 35 U.S.C. 154(b) by 0 days.

(21) Appl. No.: 14/459,120

(22) Filed: Aug. 13, 2014

(65) Prior Publication Data

US 2014/0353685 A1 Dec. 4, 2014

Related U.S. Application Data

(63) Continuation of application No. PCT/US2014/035042, filed on Apr. 22, 2014.

(60) Provisional application No. 61/814,653, filed on Apr. 22, 2013.

(51) Int. Cl.
*H01L 21/02* (2006.01)
*H01L 29/20* (2006.01)
(Continued)

(52) U.S. Cl.
CPC ....... *H01L 21/02381* (2013.01); *C30B 23/025* (2013.01); *C30B 25/18* (2013.01);
(Continued)

(58) Field of Classification Search
CPC .............. H01L 21/02389; H01L 21/02433; H01L 21/02378; H01L 21/02422; H01L 29/2003; H01L 29/167; H01L 29/045; H01L 29/1608
USPC ....................................... 257/76–77; 438/478
See application file for complete search history.

(56) References Cited

U.S. PATENT DOCUMENTS 5,741,724 A 4/1998 Ramdani et al.
7,208,393 B2 4/2007 Haskell et al.
(Continued)

FOREIGN PATENT DOCUMENTS

JP 2011-042542 3/2011
WO WO-2012/032915 3/2012

OTHER PUBLICATIONS

"International Search Report and Written Opinion of the International Searching Authority Dated Aug. 18, 2014; International Application No. PCT/US2014/035042", (Aug. 18, 2014).
(Continued)

*Primary Examiner* — Christine Enad
(74) *Attorney, Agent, or Firm* — Blakely Sokoloff Taylor & Zafman LLP

(57) ABSTRACT

A method has been developed to overcome deficiencies in the prior art in the properties and fabrication of semi-polar group III-nitride templates, films, and materials. A novel variant of hydride vapor phase epitaxy has been developed that provides for controlled growth of nanometer-scale periodic structures. The growth method has been utilized to grow multi-period stacks of alternating AlGaN layers of distinct compositions. The application of such periodic structures to semi-polar III-nitrides yielded superior structural and morphological properties of the material, including reduced threading dislocation density and surface roughness at the free surface of the as-grown material. Such enhancements enable to fabrication of superior quality semi-polar III-nitride electronic and optoelectronic devices, including but not limited to transistors, light emitting diodes, and laser diodes.

20 Claims, 3 Drawing Sheets

(51) Int. Cl.

| | | |
|---|---|---|
| *C30B 25/18* | (2006.01) | |
| *H01L 29/04* | (2006.01) | |
| *H01L 29/16* | (2006.01) | |
| *H01L 29/167* | (2006.01) | |
| *C30B 23/02* | (2006.01) | |
| *C30B 29/40* | (2006.01) | |

(52) U.S. Cl.
CPC ...... *C30B 29/406* (2013.01); *H01L 21/02378* (2013.01); *H01L 21/02389* (2013.01); *H01L 21/02422* (2013.01); *H01L 21/02433* (2013.01); *H01L 29/045* (2013.01); *H01L 29/167* (2013.01); *H01L 29/1608* (2013.01); *H01L 29/2003* (2013.01)

(56) References Cited

U.S. PATENT DOCUMENTS

| | | | |
|---|---|---|---|
| 8,629,065 B2 | 1/2014 | Spiberg et al. | |
| 8,673,074 B2 | 3/2014 | Usikov et al. | |
| 2004/0195562 A1* | 10/2004 | Munns | 257/1 |
| 2005/0245095 A1 | 11/2005 | Haskell et al. | |
| 2006/0160345 A1* | 7/2006 | Liu | H01L 21/0242 438/604 |
| 2007/0218655 A1* | 9/2007 | Sato | C30B 25/02 438/478 |
| 2008/0113496 A1* | 5/2008 | Keller et al. | 438/481 |
| 2010/0012948 A1* | 1/2010 | Usikov et al. | 257/76 |
| 2011/0062449 A1* | 3/2011 | Farrell, Jr. | B82Y 20/00 257/76 |
| 2011/0108954 A1 | 5/2011 | Spiberg et al. | |
| 2011/0278598 A1* | 11/2011 | Renaud | 257/77 |
| 2012/0091465 A1 | 4/2012 | Krames et al. | |
| 2012/0161287 A1 | 6/2012 | Iza et al. | |
| 2012/0223365 A1* | 9/2012 | Briere | 257/194 |
| 2012/0313077 A1* | 12/2012 | Nakamura et al. | 257/13 |
| 2013/0099243 A1* | 4/2013 | Chen | H01L 21/02381 257/76 |
| 2013/0181327 A1 | 7/2013 | Miyoshi et al. | |

OTHER PUBLICATIONS

Bae, S. Y., et al., "Electroluminescence enhancement of (11$\bar{2}$2) semipolar GaN light-emitting diodes grown on miscut *m*-plane sapphire substrates", *Current Applied Physics*, No. 11, (2011), pp. 954-958.

Lahourcade, Lise, et al., "Molecular beam epitaxy of semipolar AlN(11$\bar{2}$2) and GaN(11$\bar{2}$2) on *m*-sapphire", *J Mater Sci: Mater Electron*, No. 19, (2008), pp. 805-809.

Ploch, Simon, et al., "Single phase {1 1 $\bar{2}$ 2} GaN on (1 0 $\bar{1}$ 0) sapphire grown by metal-organic vapor phase epitaxy", *Journal of Crystal Growth*, No. 331, (2011), pp. 25-28.

Romanov, A. E., et al., "Strain-induced polarization in wurtzite III-nitride semipolar layers", *Journal of Applied Physics*, vol. 100, No. 2, (Jul. 25, 2006), pp. 023522-1 to 023522-10.

Strittmatter, Andre, et al., "Semi-polar nitride surfaces and heterostructures", *Phys. Status Solidi B* 248, No. 3, (2011), pp. 561-573.

Suzuki, N., et al., "HVPE growth of semi-polar (11$\bar{2}$2)GaN on GaN template (113)Si substrate", *Journal of Crystal Growth*, No. 311, (2009), pp. 2875-2878.

Usikov, Alexander, et al., "Novel HVPE technology to grow nanometer thick GaN, AlN, AlGaN layers and multi-layered structures", *phys. stat. sol.* (*c*) 4, No. 7, (2007), pp. 2301-2305.

Xu, Sheng R., et al., "Improvement of (11$\bar{2}$2) Semipolar GaN Crystal Quality with TiN Interlayer by Metal Organic Vapor Phase Epitaxy", *Japanese Journal of Applied Physics*, No. 50, (2011), pp. 115502-1 to 115502-4.

\* cited by examiner

SEMI-POLAR III-NITRIDE FILMS AND MATERIALS AND METHOD FOR MAKING THE SAME

CROSS-REFERENCE TO RELATED APPLICATIONS

This application is a continuation of International Application No. PCT/US2014/035042 filed Apr. 22, 2014 which claims the benefit of U.S. Provisional Patent Application No. 61/814,653 filed Apr. 22, 2013.

BACKGROUND OF THE INVENTION

1. Field of the Invention

The present invention relates to the field of semi-polar III-nitride films and materials and method for making the same.

2. Prior Art

Group III-nitrides, which include but are not limited to $Al_xIn_yGa_{1-x-y}N$ compositions in which $0 \le x$, $y \le 1$, are of considerable interest in many fields, such as the fabrication of high brightness light emitting diodes (LEDs), laser diodes, and power electronics. Virtually all group III-nitrides grown today are produced such that the maximum surface area available for device fabrication lies on the (00.1) c-plane, wherein the notation (hk.l) is a shorthand form of Miller-Bravais crystallographic notation to identify crystal planes in hexagonal crystals. The "." Represents the i index in (hkil) four-index notation, which is redundant as h+k+i=0. One skilled in the art further understands that (hkil) notation using parentheses refers to a specific crystal plane while notation using curly brackets such as {hkil} refers to a family of related crystallographic planes. For the purposes of this invention, { } and ( ) notation will be understood to be interchangeable as the invention typically applies to all specific planes that belong to any family of planes.

Conventional c-plane-oriented nitrides can be referred to as "polar" nitrides because of the substantial piezoelectric and spontaneous polarization fields that exist parallel to the c-axis and therefore perpendicular to the c-plane. Such polarization fields restrict performance of polar group III-nitride devices by causing color shifting, limiting radiative recombination efficiency, and reducing high-current density efficiency.

An alternate set of group III-nitride crystal orientations are referred to as "semi-polar." Semi-polar nitrides are nitride crystal planes having at least two non-zero h, k, or i indices and a non-zero l index in Miller-Bravais notation. Some common semi-polar planes include, but are not limited to, the {10.1}, {10.2}, {10.3}, {20.1}, {30.1}, and {11.2} planes.

Group III-nitrides are commonly fabricated by several techniques, including but not limited to metalorganic chemical vapor deposition (MOCVD or OMVPE), molecular beam epitaxy (MBE), and hydride vapor phase epitaxy (HVPE). The overwhelming majority of group III-nitride development has been focused on polar c-plane oriented material. Semi-polar group-III nitride planes, however, have historically proven difficult to grow by any technique using comparable parameters to polar nitrides. Indeed, one skilled in the art will recognize that growth of a semi-polar group-III nitride film, template, or free-standing layer using production parameters optimized for polar nitrides generally yields low-quality, rough, and defective material that is virtually unusable for fabrication of optoelectronic and electronic devices.

DETAILED DESCRIPTION OF THE PREFERRED EMBODIMENTS

Figure 1:
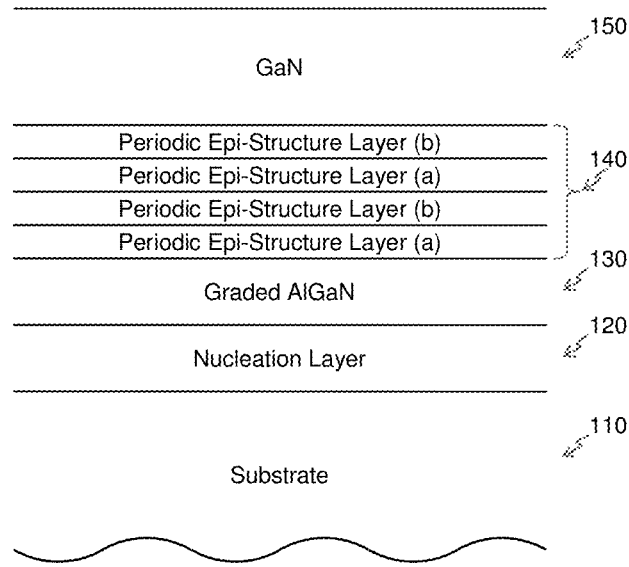
FIG. 1 illustrates a simple embodiment of the present invention having two pairs of Periodic Epi-Structure Layers grown upon a graded or stepped AlGaN layer.

The present invention provides a means of significantly reducing defect densities, reducing surface roughness, and improving functionality of semi-polar group III-nitrides. The invention utilizes a novel variant of HVPE to grow nanometer-scale periodic epi-structures on semi-polar III-nitride planes. The invention further includes the use of stepped and/or graded AlGaN layers to improve phase purity and reduce macroscopic defect densities.

Key novel elements of the invention include one or more of the following:

1. Nanometer-scale control of semi-polar AlGaN and GaN growth rates with HVPE, a technique that is known for much higher growth rates 2. Incorporation of stepped or graded AlGaN layers as a transition from optional AlN nucleation layers on the m-plane $Al_2O_3$ substrates to GaN at the free surface. In one embodiment, the film layer is transitioned from AlN to GaN in five composition steps 3. Growth of nanometer-scale periodic structures that feature alternating thin layers of AlGaN and GaN of different compositions 4. Application of the invention specifically to the growth of high-quality semi-polar group III-nitride films, templates, free-standing substrates, and bulk materials 5. Ability to grow the nanometer-scale graded AlGaN layers and periodic epi-structures in the same growth run as thin and thick AlGaN and GaN films, enabling low-cost template production compared to methods that rely on MBE or MOCVD for group III-nitride growth 6. Achievement of reduced surface roughness, reduced macroscopic defect density, and/or reduced micro-structural defect densities compared to semi-polar group III-nitrides as described in the prior art The invention is illustrated by way of example, and not by way of limitation, in the figures of the accompanying drawings in which like reference numerals refer to similar elements. References in the following detailed description of the present invention to "one embodiment" or "an embodiment" means that a particular feature, structure, or characteristics described in connection with the embodiment is included in at least one embodiment of the invention. The appearances of the phrase "in one embodiment" in various places in this detailed description are not necessarily all referring to the same embodiment. The following figures illustrate several embodiments of the invention.

FIG. 1 illustrates a template structure 100 that includes the invention. An optional nucleation layer 120 is deposited on a suitable substrate 110. A Graded AlGaN region 130 is deposited on the nucleation layer, upon which a nanometer-scale periodic epi-structure 140 is grown. A terminal group III-nitride layer such as GaN is grown upon the periodic epi-structure, represented by block 150.

Referring to FIG. 1, the substrate 110 may be any substrate that is capable of supporting group III-nitride growth, either heteroepitaxially or homoepitaxially. Examples of suitable substrate materials include, but are not limited to, sapphire, silicon, lithium aluminate, spinel, silicon carbide, gallium nitride, aluminum nitride, and silica glass. The substrate orientation can be any orientation that supports group III-nitride epitaxial growth, including but not limited to the sapphire c-plane, m-plane, r-plane, or n-plane; the silicon {100}, {110} or {111} planes; the lithium aluminate {100} plane; the silicon carbide {00.1}, {10.0}, {11.0}, {11.1}, {11.2}, {10.1}, {10.2}, {10.3}, and {20.1} planes. One skilled in the art will recognize that other substrate materials and orientations not listed here may be utilized in the practice of the invention.

The nucleation layer 120 may be any group III-nitride composition, may be deposited at any temperature ranging from 400 to 1300 degrees Celsius, and may be of any thickness from 0.1 nm to 1000 µm. The nucleation layer may further be the result of a deposition process, such as the deposition of AlN on a sapphire substrate; or may be the result of a modification of the substrate top surface, such as may be achieved by nitridizing a sapphire top surface by flowing ammonia over sapphire during annealing at high temperature, converting a one or more mono-layers of Al2O3 into AlN. The nucleation layer may further be omitted completely from the structure if so desired.

The Graded AlGaN region 130 is deposited on the nucleation layer. The Graded $Al_xGa_{1-x}N$ region involves a transition from a initial group III-nitride composition, such as $Al_{1.0}Ga_{0.0}N$ to a terminal group III-nitride composition, such as $Al_{0.0}Ga_{1.0}N$, over a total thickness ranging from approximate 5 nm to approximately 10 µm. The transition may be executed continuously, varying the composition as a function of growth time with no distinct layer structure. For example, in one embodiment the Graded AlGaN region involves a transition from AlN to GaN with a linear composition change as a function of thickness over a region thickness of 200 nm.

In an alternate embodiment, the Graded $Al_xGa_{1-x}N$ region may be executed in a series of steps from an initial composition to a terminal composition. For example, in this alternate embodiment the Graded $Al_xGa_{1-x}N$ region consists of a transition from AlN to GaN including six distinct layers having compositions of $Al_{1.00}Ga_{0.00}N$, $Al_{0.80}Ga_{0.20}N$, $Al_{0.60}Ga_{0.40}N$, $Al_{0.40}Ga_{0.60}N$, $Al_{0.20}Ga_{0.80}N$, and $Al_{0.00}Ga_{1.00}N$, respectively.

In another embodiment, a portion of the Graded $Al_xGa_{1-x}N$ region is compositionally varied continuously while another portion is varied stepwise. The thickness of each gradation need not be constant throughout the Graded $Al_xGa_{1-x}N$ layer. One skilled in the art will recognize that the specific number of gradations in and the total thickness of the Graded $Al_xGa_{1-x}N$ region may be varied without deviating from the scope of the present invention.

The Periodic Epi-Structure 140 consists of pairs of group III-nitride layers having dissimilar composition that are grown upon one another. Referring to FIG. 1, one of the layers has been denoted Layer (a) and the other denoted as Layer (b) in block 140. It is essential that the (a) and (b) layers consist of dissimilar group III-nitride compositions from one another. For example, in one embodiment Layer (a) is represents $Al_{0.80}Ga_{0.20}N$, while Layer (b) is $Al_{0.00}Ga_{1.00}N$. In the simplest implementation of the invention, all (a) layers in the Periodic Epi-Structure would consist of similar compositions to all other (a) layers, while all (b) layers in the Periodic Epi-Structure would consist of similar compositions to all other (b) layers. However, in some embodiments it is desirable to vary the composition of either the (a) layers or (b) layers (or both) through the thickness of the Periodic Epi-Structure. Such variation is compatible with the invention provided that each layer consists of a compositionally distinct group III-nitride from the immediately adjacent layers.

In the simple embodiment illustrated in FIG. 1, two pairs of Periodic Epi-Structure Layers 140 are illustrated. The number of pairs of Periodic Epi-Structure Layers used in practice will vary from approximately two pairs to approximately 200 pairs.

The thickness of the (a) and (b) layers in the Periodic Epi-Structure will each typically range from approximately 1 nm to approximately 100 nm. There is no requirement that identical thicknesses be used for all (a) layers and all (b) layers, respectively. In one embodiment, the thickness of the (a) layers is approximately 5 nm and the thickness of the (b) layers is approximately 20 nm. The thickness of the layers can be varied throughout the thickness of the Periodic Epi-Structure as well. For example, it may be desirable to utilize a structure in which the layer thicknesses are approximately 5 nm each for five pairs, followed by thicknesses of 10 nm each for five pairs. One skilled in the art will recognize that many variations of layer thicknesses can be utilized successfully in the practice of the invention.

The top layer represented by block 150 represents the terminal composition of the thin film or template that is grown utilizing the invention. Typically, this top layer will consist of GaN, but in practice it can consist of any group III-nitride alloy composition. This layer can be grown at different growth rates and can also be doped with modifying atoms or ions, including but not limited to Si, C, O, Mg, and Zn.

The thickness of the top layer may range from 1 nm in the case of thin templates to 50 mm in the case of bulk nitride materials grown for use as free-standing substrates. Typically, the top layer thickness will be approximately five to ten micrometers for group III-nitride template fabrication. Similarly, typical thicknesses for free-standing film production are on the order of 250-1000 μm. One skilled in the art will recognize that many ranges of thicknesses are compatible with the practice of the invention.

Figure 2:
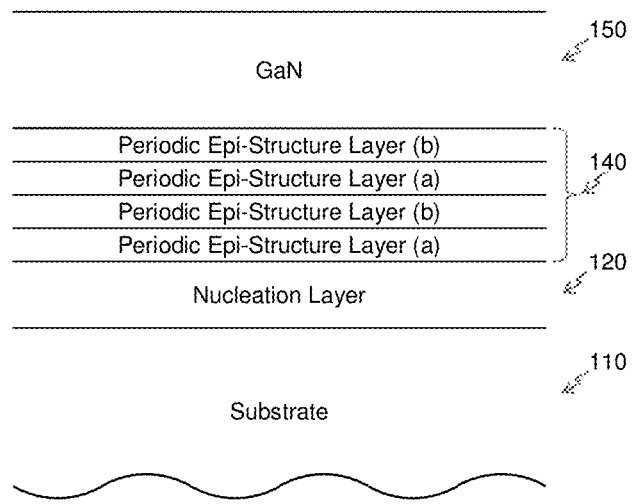
FIG. 2 illustrates an embodiment of the present invention wherein the Graded $Al_xGa_{1-x}N$ Layer has been eliminated and defect reduction is achieved by way of the use of Periodic Epi-Structure inclusion.

The invention can also be practiced with the exclusion of the Graded $Al_xGa_{1-x}N$ Layer, as illustrated in FIG. 2. In the embodiment illustrated by block 101, the Periodic Epi-Structure 140 is grown upon the Nucleation Layer 120.

Figure 3:
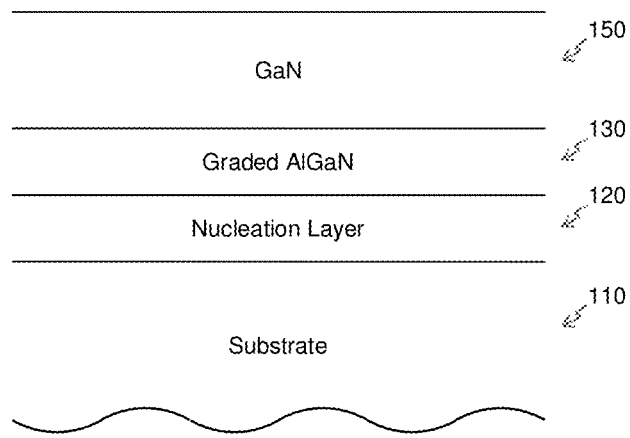
FIG. 3 illustrates an embodiment of the present invention wherein the Periodic Epi-Structure has been eliminated and defect reduction is achieved by way of the use of a graded AlGaN layer.

The invention can also be practiced with the exclusion of the Periodic Epi-Structure 140, as illustrated in FIG. 3. In the embodiment illustrated in block 102, the terminal GaN Layer 150 is grown upon the Graded $Al_xGa_{1-x}N$ layer 130.

One skilled in the art will further recognize that the order of the blocks as illustrated in FIGS. 1-3 can be rearranged without fundamentally deviating from the scope of the invention. For example, the Graded $Al_xGa_{1-x}N$ Layer could be grown upon the Periodic Epi-Structure instead of being grown in the order described in FIG. 1. It should also be emphasized that additional layers not described herein could be inserted into the structure. For example, in one embodiment a GaN layer is grown upon the nucleation layer, upon which the Graded $Al_xGa_{1-x}N$ layer is grown. Such additions of supplemental layers are consistent with the scope and practice of the invention.

Figure 4:
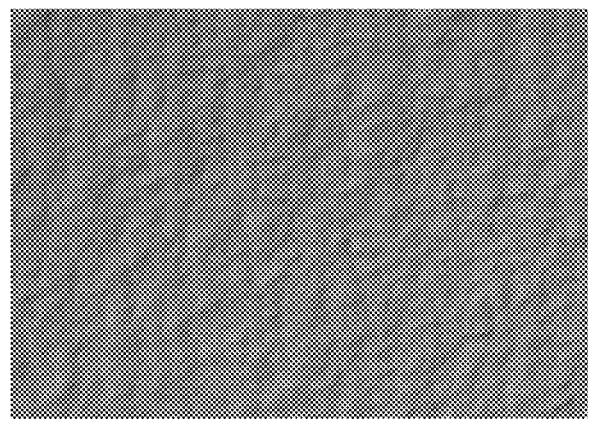
FIG. 4 is a Nomarski optical contrast micrograph showing an approximately 15 of (11.2) GaN grown upon a $Al_{0.35}Ga_{0.65}N$ intermediate layer grown upon an AlN nucleation layer on a m-plane sapphire substrate without the benefit of the present invention.

FIGS. 4-7 provide Nomarski optical contrast micrographs illustrating improved surface morphology of {11.2} GaN and $Al_xGa_{1-x}N$ films incorporating the present invention. In FIG. 4, an $Al_xGa_{1-x}N$ surface grown without the invention is shown. This film consisted of approximately 15 μm of (11.2) GaN grown upon a $Al_{0.35}Ga_{0.65}N$ intermediate layer grown upon an AlN nucleation layer on a m-plane sapphire substrate.

Figure 5:
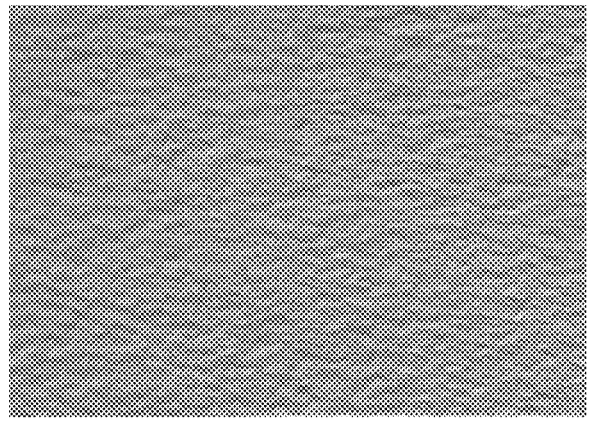
FIG. 5 is a Nomarski optical contrast micrograph showing a GaN film grown upon a 10-period Periodic Epi-Structure consisting of (a) layers consisting $Al_{0.35}Ga_{0.65}N$ and (b) layers consisting of GaN. The Periodic Epi-Structure was grown on a Graded $Al_xGa_{1-x}N$ layer that transitioned from AlN to GaN in five steps in accordance with an embodiment of the invention.

FIG. 5 shows a Nomarski optical contrast micrograph of a GaN film grown upon a 10-period Periodic Epi-Structure consisting of (a) layers consisting of $Al_{0.35}Ga_{0.65}N$ and (b) layers consisting of GaN. The Periodic Epi-Structure was grown on a Graded $Al_xGa_{1-x}N$ layer that transitioned from AlN to GaN in five steps. A comparison of surface roughness between FIG. 5 and FIG. 4 clearly shows the superior quality of the surface in FIG. 5.

Figure 6:
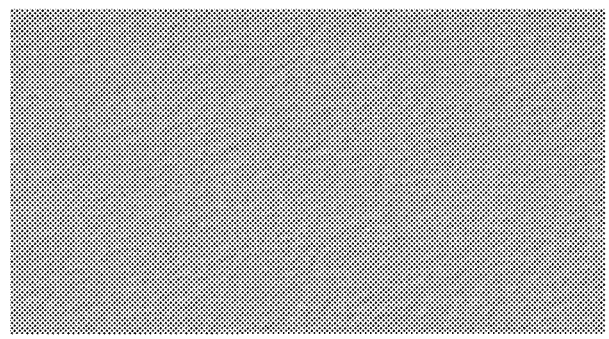
FIG. 6 is a Nomarski optical contrast micrograph showing a GaN film grown upon a 10-period Periodic Epi-Structure consisting of (a) layers consisting $Al_{0.85}Ga_{0.15}N$ and (b) layers consisting of GaN. The Periodic Epi-Structure was grown on a Graded $Al_xGa_{1-x}N$ layer that transitioned from AlN to GaN in five steps in accordance with an embodiment of the invention.

FIG. 6 shows a Nomarski optical contrast micrograph of a GaN film grown upon a 10-period Periodic Epi-Structure consisting of (a) layers consisting $Al_{0.85}Ga_{0.15}N$ and (b) layers consisting of GaN. The Periodic Epi-Structure was grown on a Graded $Al_xGa_{1-x}N$ layer that transitioned from AlN to GaN in five steps. A comparison of surface roughness between FIG. 6 and FIG. 4 clearly shows the superior quality of the surface in FIG. 6.

Figure 7:
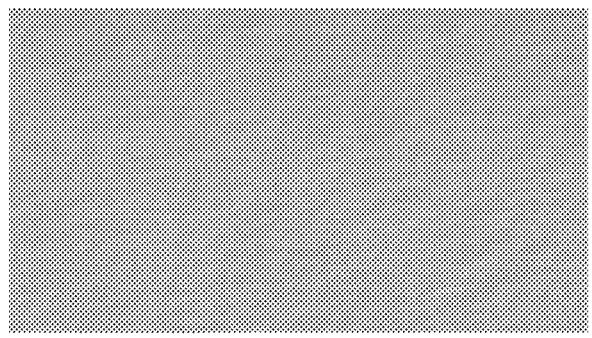
FIG. 7 is a Nomarski optical contrast micrograph showing a GaN film grown upon a 10-period Periodic Epi-Structure consisting of $Al_{0.85}Ga_{0.15}N$ and (b) layers consisting of GaN in accordance with an embodiment of the invention. The Periodic Epi-Structure was grown on a Graded $Al_xGa_{1-x}N$ layer that transitioned from AlN to GaN in five steps. The terminal GaN layer grown at a reduced growth rate.

FIG. 7 shows a Nomarski optical contrast micrograph of a GaN film grown upon a 10-period Periodic Epi-Structure consisting of (a) layers consisting $Al_{0.85}Ga_{0.15}N$ and (b) layers consisting of GaN. The Periodic Epi-Structure was grown on a Graded $Al_xGa_{1-x}N$ layer that transitioned from AlN to GaN in five steps. In this epi-growth example the terminal GaN layer was grown at a reduced growth rate, yielding further reduction in surface roughness. A comparison of surface roughness between FIG. 7 and FIG. 4 clearly shows the superior quality of the surface in FIG. 7.

The incorporation of the present invention into the growth of semi-polar group III-nitrides can reduce terminal layer surface roughness by 75% or more compared to semi-polar group III-nitride films grown without the invention. The invention further improves micro-structural quality of the terminal group III-nitride layers by blocking propagation of micro-structural defects and relieving strain related to lattice mismatch and thermal expansion mismatch.

What is claimed is:

1. A method of producing a terminal semi-polar group III-nitride layer on a dissimilar substrate with nanometer scale control of semi-polar AlGaN and GaN growth rates, the method comprising:
   a) Selecting a suitable substrate from the group consisting of sapphire, silicon carbide, magnesium aluminate spinel, lithium aluminate, silicon, silica glass, gallium nitride, aluminum nitride, or alloys thereof;
   b) Growing an aluminum nitride nucleation layer on the substrate at any temperature ranging from 400 to 1300 degrees Celsius, and any thickness from 0.1 nm to 1000 μm;
   c) Growing a stepped aluminum gallium nitride layer, wherein the stepped aluminum gallium nitride layer consists of six steps of $Al_xGa_{1-x}N$ compositions including $Al_{1.00}Ga_{0.00}N$, $Al_{0.80}Ga_{0.20}N$, $Al_{0.60}Ga_{0.40}N$, $Al_{0.40}Ga_{0.60}N$, $Al_{0.20}Ga_{0.80}N$, and $Al_{0.00}Ga_{1.00}N$;
   d) Growing of a periodic epi-structure consisting of alternating layers of group III-nitrides of dissimilar compositions at alternating precursor flows and alternating temperatures; and
   e) Growing the terminal semi-polar group III-nitride layer upon the underlying nanometer scale III-nitride stepped layers and/or periodic structures.

2. The method of claim 1 wherein the semi-polar group III-nitride is oriented about a plane selected from group of orientations consisting of {10.1}, {10.2}, {10.3}, {20.1}, {30.1}, and {11.2} planes or their mixture.

3. The method of claim 1 wherein the substrate is {10.0} m-plane sapphire treated at any temperature ranging from 400 to 1300 degrees Celsius.

4. The method of claim 3 wherein the aluminum nitride nucleation layer is formed by reacting the substrate surface with ammonia for no less than 10 min relieving strain relating to lattice mismatch and thermal expansion mismatch.

5. The method of claim 1 wherein the semi-polar group III nitride layer is grown utilizing metalorganic chemical vapor deposition, hydride vapor phase epitaxy, or molecular beam epitaxy or their interplay.

6. The method of claim 1 wherein the distinct compositions of AlGaN are each them grown at distinctly different temperature and distinctly different ammonia flow.

7. The method of claim 1 wherein the periodic epi-structure consists of alternating layers of AlGaN and GaN deposited at corresponding periodic ammonia flow and corresponding periodic variations of temperature.

8. The method of claim 7 wherein the periodic epi-structure consists of between two to two hundred pair of alternating layers of AlGaN and GaN deposited at between two and two hundred corresponding periodic variations of ammonia flow and between two and two hundred corresponding periodic variations of temperature.

9. The method of claim 1 wherein c) precedes d), so that the periodic epi-structure is grown on a stepped aluminum gallium nitride layer under periodic variation of ammonia flow and periodic variation of growth temperature.

10. The method of claim 1 wherein d) precedes c), so that the stepped aluminum gallium nitride layer is grown upon a periodic epi-structure at gradual variation of ammonia flow and gradual variation of temperature.

11. The method of claim 1 wherein the terminal semi-polar group III-nitride layer consists of GaN deposited at any temperature ranging from 700 to 1100 degrees Celsius.

12. The method of claim 1 wherein the terminal semi-polar group III-nitride layer contains dopants selected from the group consisting of silicon, magnesium, zinc, iron, oxygen, or carbon or their mixture.

13. An aluminum gallium nitride template grown upon a sapphire substrate via the method of claim 1 at reduced growth rate, yielding further reduction in surface roughness.

14. The method of claim 1, wherein the terminal semi-polar group III-nitride layer is grown at any temperature ranging from 700 to 1100 degrees Celsius.

15. A method of producing a terminal semi-polar group III-nitride layer on a dissimilar substrate with nanometer scale control of semi-polar AlGaN and GaN growth rates, the method comprising:
   a) Selecting a suitable substrate from the group consisting of sapphire, silicon carbide, magnesium aluminate spinel, lithium aluminate, silicon, silica glass, gallium nitride, aluminum nitride, or alloys thereof;
   b) Growing an aluminum nitride nucleation layer on the substrate at any temperature ranging from 400 to 1300 degrees Celsius, and any thickness from 0.1 nm to 1000 µm;
   c) Growing a graded aluminum gallium nitride layer that involves a transition from an initial group III-nitride composition to a terminal group III-nitride composition over a total thickness ranging from approximately 5 nm to approximately 10 µm, wherein the transition is executed continuously, varying the composition as a function of growth time with no distinct layer structure;
   d) Growing of a periodic epi-structure consisting of alternating layers of group III-nitrides of dissimilar compositions at alternating precursor flows and alternating temperatures;
   e) Growing the terminal semi-polar group III-nitride layer upon the underlying nanometer scale III-nitride graded layers and/or periodic structures.

16. The method of claim 15 wherein in c) and e), the graded aluminum gallium nitride layer of c) consists of continuously varying compositions of AlGaN from a starting AlGaN composition to the terminal semi-polar group III-nitride layer of e), the terminal semi-polar group III-nitride layer being of an AlGaN composition wherein variation of AlGaN composition is followed by the ammonia flow variation and growth temperature variation.

17. The method of claim 16 wherein the starting $Al_xGa_{1-x}N$ composition is at x=1 deposited at any temperature ranging from 400 to 1300 degrees Celsius.

18. The method of claim 16 wherein the terminal semi-polar group III-nitride layer is of a GaN composition deposited at a reduced growth rate, yielding reduction in surface roughness, macroscopic defect density, and/or micro-structural defect densities.

19. A semi-polar gallium nitride template grown on a sapphire substrate via the method of claim 15 wherein a transition to GaN from AlN involves a linear composition change as a function of thickness over a region thickness of 200 nm.

20. A method of producing a terminal semi-polar group III-nitride layer on a dissimilar substrate with nanometer scale control of semi-polar AlGaN and GaN growth rates, the method comprising:
   a) Selecting a suitable substrate from the group consisting of sapphire, silicon carbide, magnesium aluminate spinel, lithium aluminate, silicon, silica glass, gallium nitride, aluminum nitride, or alloys thereof;
   b) Growing an aluminum nitride nucleation layer on the substrate at any temperature ranging from 400 to 1300 degrees Celsius, and any thickness from 0.1 nm to 1000 µm;
   c) Growing a stepped or graded aluminum gallium nitride layer that involves a transition from an initial group III-nitride composition to a terminal group III-nitride composition over a total thickness ranging from approximately 5 nm to approximately 10 µm, wherein a composition of a first portion of the stepped or graded aluminum gallium nitride layer is varied continuously, and a composition of a second portion of the stepped or graded aluminum gallium nitride layer is varied stepwise;
   d) Growing of a periodic epi-structure consisting of alternating layers of group III-nitrides of dissimilar compositions at alternating precursor flows and alternating temperatures;
   e) Growing the terminal semi-polar group III-nitride layer upon the underlying nanometer scale III-nitride stepped or graded layers and/or periodic structures.

* * * * *